(12) United States Patent
Kato et al.

(10) Patent No.: US 6,310,997 B1
(45) Date of Patent: Oct. 30, 2001

(54) FERRULE ASSEMBLY AND OPTICAL MODULE HAVING THE SAME

(75) Inventors: Takashi Kato; Hiroyuki Nakaya, both of Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/352,893

(22) Filed: Jul. 14, 1999

Related U.S. Application Data (63) Continuation-in-part of application No. 08/633,522, filed on Apr. 17, 1996.

(30) Foreign Application Priority Data

| Apr. 17, 1995 | (JP) | 7-090561 |
| Jul. 15, 1998 | (JP) | 10-200346 |
| Apr. 28, 1999 | (JP) | 11-123244 |

(51) Int. Cl.[7] ........................ G02B 6/34
(52) U.S. Cl. .................. 385/37; 385/38; 385/31
(58) Field of Search .................. 385/31, 37, 38

(56) References Cited

U.S. PATENT DOCUMENTS

| 4,786,132 | 11/1988 | Gordon . | |
| 5,359,689 | 10/1994 | Iwatsuka et al. . | |
| 5,367,589 | * 11/1994 | MacDonald et al. | 385/37 |
| 5,859,944 | * 1/1999 | Inoue et al. | 385/73 |
| 5,914,972 | * 6/1999 | Siala et al. | 372/33 |
| 5,987,200 | * 11/1999 | Fleming et al. | 385/37 |
| 6,069,988 | * 5/2000 | Kokura et al. | 385/37 |

FOREIGN PATENT DOCUMENTS

| 0 635 736 | 1/1995 | (EP) . |
| 61-138217 | 6/1986 | (JP) . |
| 62-119508 | 5/1987 | (JP) . |
| 3-093285 | 4/1991 | (JP) . |
| 94/17448 | 8/1994 | (WO) . |

OTHER PUBLICATIONS

"Narrow Line Semiconductor Laser Using Fibre Grating", Electronics Letters, Jun. 20, 1991, vol. 27, No. 13, pp. 1115–1116.

"Reduction of Optical–Feedback–Induced Frequency Noise in Pigtailed Laser Diodes", Electronics Letters, Jun. 22, 1989, vol. 25, No. 13, pp. 863–864.

\* cited by examiner

*Primary Examiner*—Ellen E. Kim
(74) *Attorney, Agent, or Firm*—McDermott, Will & Emery (57) ABSTRACT

The present invention relates to a ferrule assembly capable of yielding a laser resonator which is less likely to be influenced by variations in manufacture and changes in its environment of use, and an optical module equipped with this ferrule assembly. The ferrule assembly comprises a fiber grating and a ferrule attached to a front end portion of the fiber grating. As one of structural features of the ferrule assembly, the portion of the fiber grating excluding a grating region is secured to a securing portion of the ferrule, whereas the grating region is accommodated in an accommodating portion of the ferrule in a state separated from the inner wall of the accommodating portion by a predetermined distance without being secured to the ferrule.

18 Claims, 9 Drawing Sheets

| Sample No. | Angle θ | Diameter difference (μm)* | Result | Solder state |
|---|---|---|---|---|
| 1 | 50 | 5 | Success | |
| 2 | 50 | 10 | Success | |
| 3 | 50 | 15 | Failure | Flowed into hole |
| 4 | 55 | 5 | Success | |
| 5 | 55 | 10 | Success | |
| 6 | 55 | 15 | Failure | Flowed into hole |
| 7 | 60 | 5 | Success | |
| 8 | 60 | 10 | Success | |
| 9 | 60 | 15 | Failure | Flowed into hole |
| 10 | 65 | 5 | Success | |
| 11 | 65 | 10 | Success | |
| 12 | 65 | 15 | Failure | Flowed into hole |
| 13 | 70 | 5 | Failure | Flowed out of hole |
| 14 | 70 | 10 | Failure | Flowed out of hole |
| 15 | 70 | 15 | Failure | Flowed into hole |

FERRULE ASSEMBLY AND OPTICAL MODULE HAVING THE SAME

RELATED APPLICATIONS

This is a Continuation-In-Part application of application Ser. No. 08/633,522 filed on Apr. 17, 1996, now pending.

BACKGROUND OF THE INVENTION

1. Field of the Invention

The present invention relates to a ferrule assembly and an optical module having the ferrule assembly, specifically serving as a light source of optical communication, optical fiber amplifiers, and the like.

2. Related Background Art

Laser modules are basically composed of a light-emitting device as a light source and an optical resonator comprising a pair of reflectors mutually reflecting the light emitted from the light-emitting device.

In the laser modules mentioned above, one of the reflectors constituting the resonator is one facet (back facet) of the light-emitting device itself or dielectric films having a high reflectivity formed on this back facet. A Bragg grating disposed near an end portion of the optical fiber opposing the light-emitting device is utilized as the other reflector. The Bragg grating is formed within the optical fiber by providing a periodic refractive index alteration, and reflects specific light determined by the Bragg diffraction condition. The optical fiber in which a Bragg grating is formed is described as grating faiber and is advantageous that the desirable oscillation wavelength can easily be selected by the specification of the Bragg grating.

In case of an optical resonator constituted by one facet of the light-emitting device and a grating fiber, a ferrule is attached to an end portion of the grating fiber, and a ferrule assembly constituted by the grating fiber and the ferrule is secured at a predetermined position. An optical coupling between the light-emitting device and the grating fiber can be realized by disposing an optical element (lens) between the facet of the light-emitting device and the end face of the grating fiber facing each other. The optical coupling can also be realized by rounding the facet of the grating fiber instead of providing the optical element.

In a typical configuration of the ferrule assembly, it is common that the optical axis of the light-emitting device and the grating fiber are aligned to each other. In order to prevent the light reflected by the front facet of the light-emitting device back into the waveguide of the light-emitting device again, however, the front facet of the light-emitting device is vertically inclined off the optical axis by a predetermined angle.

In case where the facet of the grating fiber is rounded, the ferrule assembly has such a configuration that the end portion of the grating fiber protrudes from the end surface of the ferrule. It is due to the fact that, while the facet of the light-emitting device and the end face of the grating fiber must be installed close to each other, it is structurally difficult for the ferrule to approach the light-emitting device. Hence, a part of the end of the grating fiber including the rounded facet thereof protrudes from the end surface of the ferrule.

As a result of detailed studies concerning the above-mentioned resonator, the inventor has found that the resonator characteristic is attributed to the structure of the ferrule assembly.

The first factor affecting to the resonator characteristic lies in tightly securing the whole portion of fiber grating to the inner wall of the ferrule with an adhesive. In this case, due to deformations, thermal expansions, and the like of the ferrule, a stress is directly applied to the fiber grating. The reflection characteristic of the fiber grating would change. The second factor is, when the grating fiber and the ferrule are not firmly fixed to each other, the installed position of the grating fiber may shift gradually due to the environment conditions. As a result, the coupling efficiency between the light-emitting device and the grating fiber deteriorates.

SUMMARY OF THE INVENTION

In order to overcome the problems mentioned above, it is an object of the present invention to provide a ferrule assembly which is not influenced by manufacture and environment conditions, and an optical module equipped with the ferrule assembly.

For achieving the object, the ferrule assembly of the present invention comprises a grating fiber and a ferrule attached to an end portion of the grating fiber. The grating fiber includes a Bragg grating disposed apart from one end face by a predetermined distance. The ferrule comprises a securing portion for securing the grating fiber and an accommodating portion for accommodating the grating region in which the Bragg grating is disposed.

In particular, the ferrule assembly is characterized in that, while the portion of the grating fiber excluding the grating region is secured to the securing portion, the grating region is accommodated in the accommodating portion of the ferrule in a state apart from the inner wall without being secured to the ferrule.

As a consequence, the grating region would not receive any stress from the ferrule even when the ferrule is mechanically or thermally deformed. Stable optical characteristics, i.e., stable resonance characteristics, can be attained.

Further, the ferrule assembly of the present invention may have a configuration in which an opening end of the insertion bore of the ferrule is provided with a tapered portion. The grating fiber and the ferrule are secured to each other with solder at the tapered portion. Since the solder can appropriately be lead to a desirable securing position, scattering of the securing strength between the grating fiber and ferrule among products can be suppressed. The member to be secured to the ferrule is not needed to be a grating fiber such as that mentioned above but may be a standard single-mode fiber without a Bragg grating. This configuration is widely applicable to technologies in which a ferrule and an optical fiber are secured to each other with solder.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Detailed description of the present invention will be described referring to the accompanying drawings as follows.

In the method of manufacturing an optical module, a grating fiber, which is an optical component with a Bragg grating, is generally used as one of the mirrors of an optical resonator.

Figure 1:
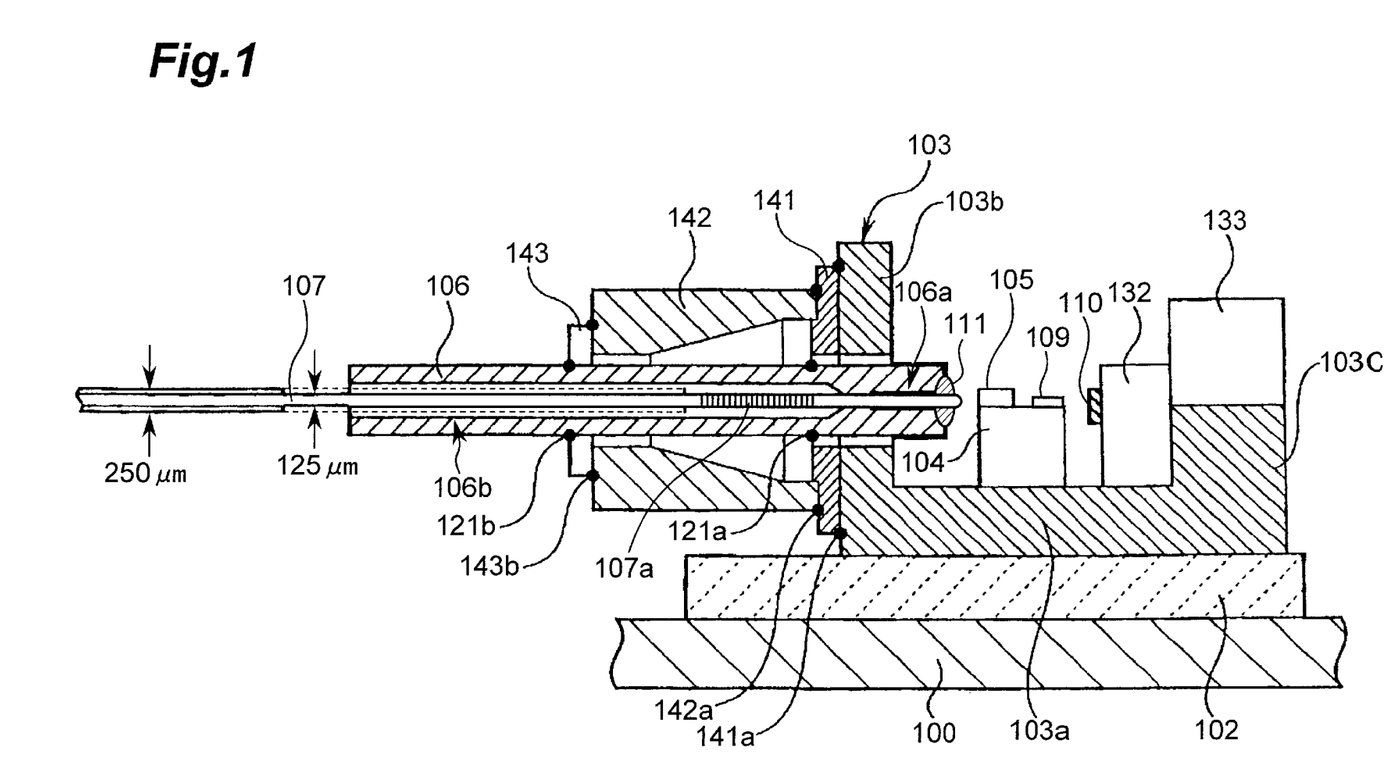
FIG. 1 is a view showing a cross-sectional structure of an embodiment of the optical module of the present invention.

FIG. 1 is a sectional view showing a structure of the optical module of the present invention employing a ferrule assembly.

In the optical module, the light-emitting device 105 is mounted on the base 103 with the sub-mount 104 interposed therebetween. Also, one end 103b of the base 103 rises vertically and is provided with a through hole to which the ferrule 106 holding the grating fiber 107 is inserted therethrough. For monitoring the operation of the light-emitting device 105, the light-receiving device 110 is also mounted behind the light-emitting device 105. Assembly members such as those mentioned above and installed in the package 100 are mounted on the temperature control device 102 such as Peltier effect device, and is configured so as to maintain an operation temperature as constant as possible by feedback control through the temperature detecting device 109 mounted on the sub-mount 104.

In FIG. 1, the base 103 comprises a portion 103a mounted with the sub-mount 104, and portions 103b extending in a direction perpendicular to the portion 103a, whereas the portion 103c supports a member 133 and a member 132 for holding the light-receiving device 110. The ferrule assembly is firmly secured by a plurality of support members 141, 142, 143. In the drawing, 121a, 121b, 141a, 142a, and 143a indicate the respective YAG-welding portions of the individual members 141 to 143.

In the optical laser module shown here, the grating region separated from the end of the grating fiber 107 by a predetermined distance is provided with the Bragg grating 107a. The Bragg grating 107a constitutes an optical resonator in cooperation with the reflecting film formed in the light-emitting device 105. In this embodiment, the Bragg grating 107a is formed into the end portion of the grating fiber 107, and the rounded end face is disposed very close to the light-emitting device 105, whereby the resonator length is made as short as possible (optical elements such as lens and the like are unnecessary as well).

FIGS. 2A to 2D are sectional views showing various configurations of the ferrule assembly. In the following descriptions, all the constituents common among drawings are referred to with identical reference numerals without repeating their detailed explanations.

Figure 2A:
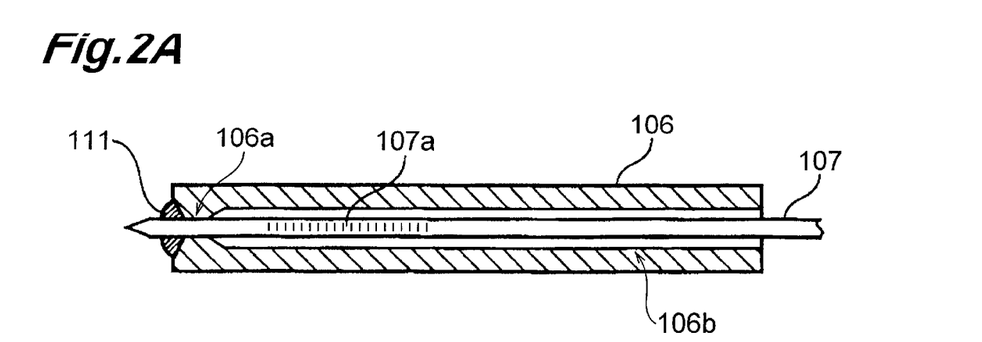
FIGS. 2A to 2D are views showing various configurations of the ferrule assembly of the present invention.

In the configuration shown in FIG. 2A, the grating fiber 107 inserted through the ferrule 106 is secured with solder 111 only at the end portion (securing portion 106a) of the ferrule 106. The end portion of the grating fiber 107 protrudes from the end face of the ferrule 106 by on the order of several hundreds of micrometers to several millimeters, whereas the end face of the grating fiber 107 is rounded and provided with a anti-reflecting coating.

On the other hand, the end face of the ferrule 106 is tapered about the insertion bore (the securing portion of the ferrule 106 being provided with a tapered opening for soldering). Also, the portion of the tapered opening where the solder attaches is plated with gold, so that the solder favorably attaches to the ferrule 106 side. The inner diameter of the ferrule 106 on the other side (the accommodating portion 106b for the Bragg grating 107a) is made larger, i.e., on the order of 0.3 to 1 mm, so as to facilitate the insertion of the grating fiber 107 and apply no stress to the fiber grating 107a. The inner diameter of the securing portion where the diameter is the smallest and about 126 μm. Since the diameter of the grating fiber 107 is 125 μm, and the gap between the ferrule 106 and the grating fiber 107 is 1 μm, the axial centers of the ferrule 106 and grating fiber 107 substantially coincide with each other.

Though solder is used for securing the grating fiber 107 in this embodiment, various other adhesives may also be used. If the grating fiber 107 is secured as mentioned above, the ferrule can be handled integrally with the grating fiber 107. In the configuration shown in FIG. 2A, no stress is applied to the Bragg grating 107a.

In the optical module employing the ferrule assembly with the configuration shown in FIG. 2A, however, there is a possibility of the solder flowing into the gap between the ferrule 106 and the grating fiber 107. In such a case, an unnecessary stress would be applied to the Bragg grating 107a. Therefore, in the configuration shown in FIG. 2B, the gap between the ferrule 106 and the grating fiber 107 is filled with a cushioning material 112. While examples of the cushioning material 112 include epoxy resins and the like, any material can be chosen as long as it has a Young's modulus lower than that of the grating fiber 107. Employing such a material reduces the stress applied to the accommodated grating region even when the ferrule 106 itself is deformed.

Figure 2B:
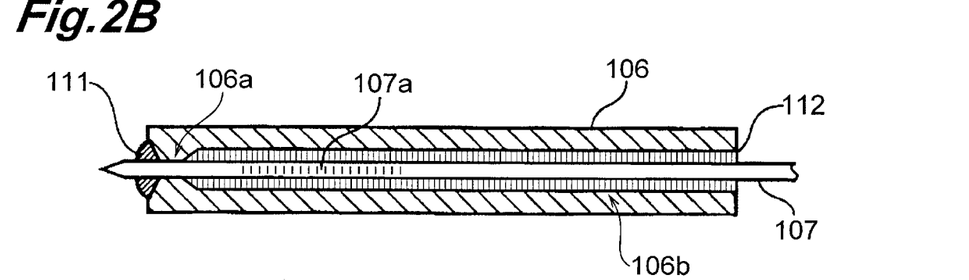
Figure 2C:
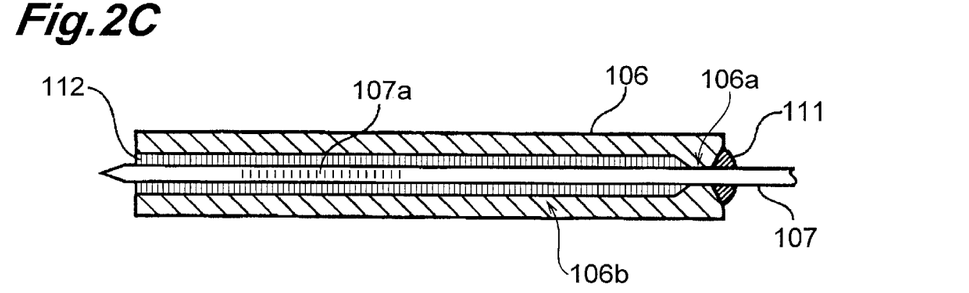

The configuration shown in FIG. 2C is the same as that shown in FIG. 2B except that the securing position of the ferrule 106 and grating fiber 107 is different. Such a configuration would function similarly to that shown in FIG. 2B.

Figure 2D:
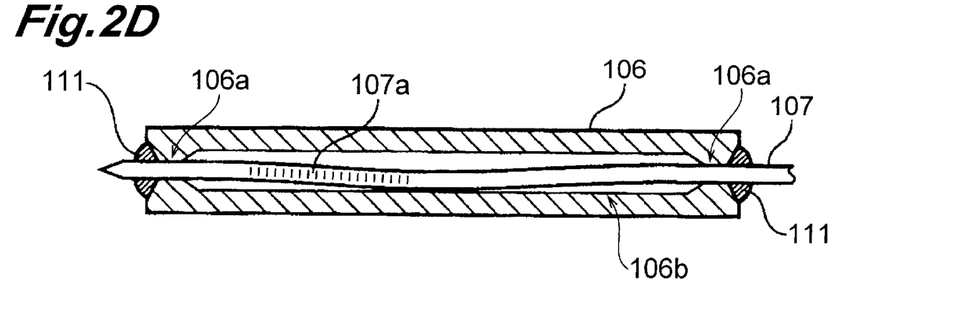

In the configuration shown in FIG. 2D, each of the ends of the ferrule 106 is provided with a securing portion 106a (at which the inner diameter of the insertion bore is smaller than that of the accommodating portion 106b), so that the grating fiber 107 is secured at each securing portion 106a with solder 111. A grating fiber 107 longer than the accommodating portion 106b is accommodated within the ferrule 106, so as to be slackened. Therefore, even when the ferrule 106 is deformed or thermally expanded, no stress would be applied to the Bragg grating 107a. As with the other configurations, solder or an adhesive can be used for securing. Also, in order to prevent solder from flowing into the inside of the ferrule 106, the accommodating space of the ferrule 106 may be filled with a cushioning material.

As the cushioning material, any of epoxy resins is preferable. As the material of the ferrule 106, any of metal and metal-plated ceramic is preferable. The grating fiber 107 is secured with solder to the ferrule at the plated portion of the ferrule.

As mentioned above, in the configuration utilizing the Bragg grating formed in the optical fiber as an external resonator, it is preferred that the end of the optical fiber and the light-emitting device are disposed as close as possible to each other. Therefore, other components such as lens and the like must avoid to insert between the optical fiber and the light-emitting device. It is essential to round the end of the optical fiber. In the state where the ferrule is attached to the grating fiber, however, it is difficult to round the end portion of the optical fiber. As a consequence, it is necessary to manufacture the ferrule assembly in which the end of the grating fiber is rounded at first and then the ferrule is attached thereto.

Figure 3A:
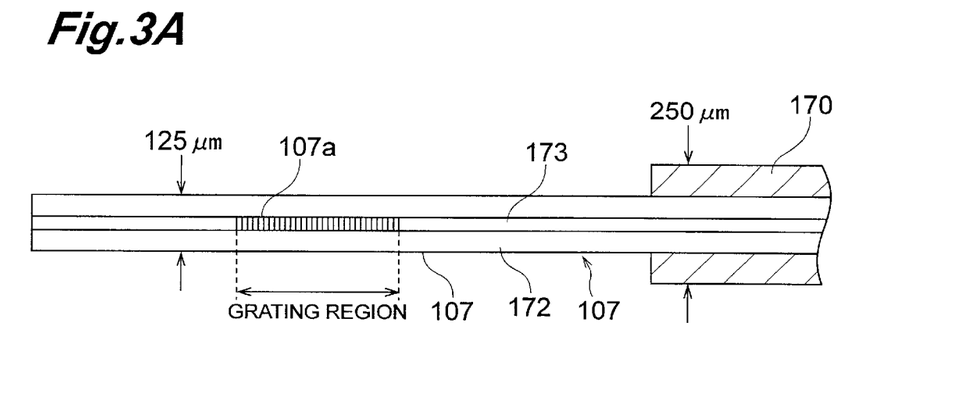
FIGS. 3A to 3C are views for explaining manufacturing steps of a ferrule assembly.
Figure 3B:
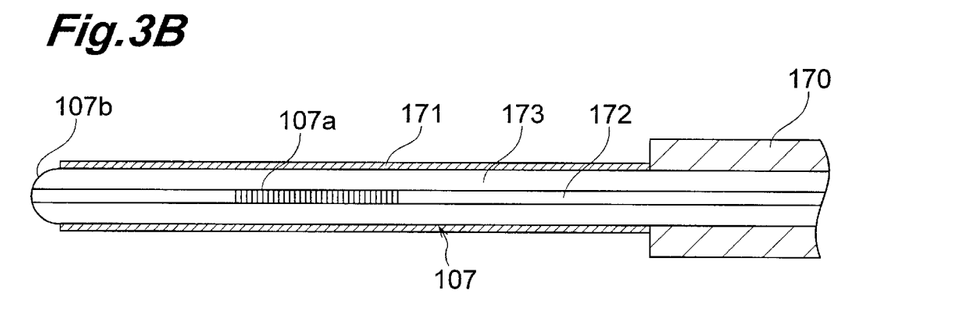
Figure 3C:
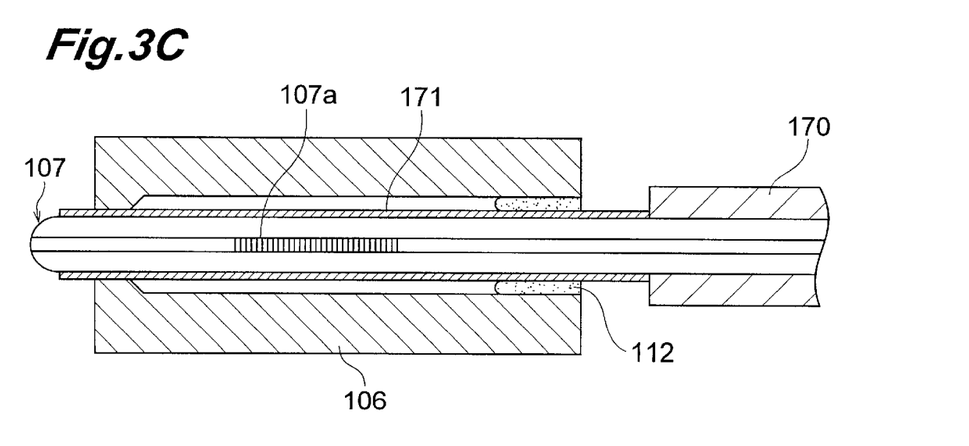

FIGS. 3A to 3C are views for explaining steps of attaching a ferrule to a grating fiber.

As shown in FIG. 3A, the grating fiber 107 is basically an optical fiber comprising a cladding 172 and a core 173 in which the Bragg grating 107a is formed within the grating region located near an end portion thereof. In particular, in this manufacturing step, the grating fiber 107 is stripped of its coating layer 170, whereby its end portion is exposed. Subsequently, as shown in FIG. 3B, an end portion 107b of such a grating fiber 107 is processed into a spherical form, and its side face is plated with a metal 171 made of Au, or laminated with one of Ni and Cr, and Au successively. The grating grating 107 with thus metal-coated side face is inserted into a ferrule 106 as shown in FIG. 3C, and is secured to one end of the ferrule 106 with solder. The gap between the end of the ferrule 106 and the grating fiber 107 is filled with a resin material 112 such as epoxy or the like. Thus integrating the grating fiber 107 with the ferrule 106 reduces the possibility of the grating fiber 107 being damaged.

Figure 4A:
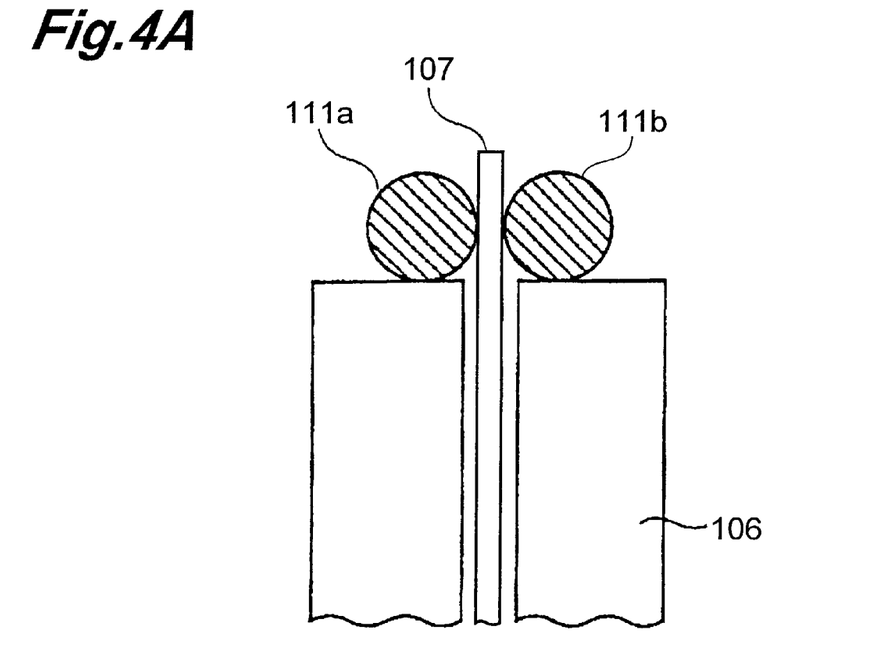
FIGS. 4A and 4B are views for explaining steps of securing an optical fiber to a ferrule.
Figure 4B:
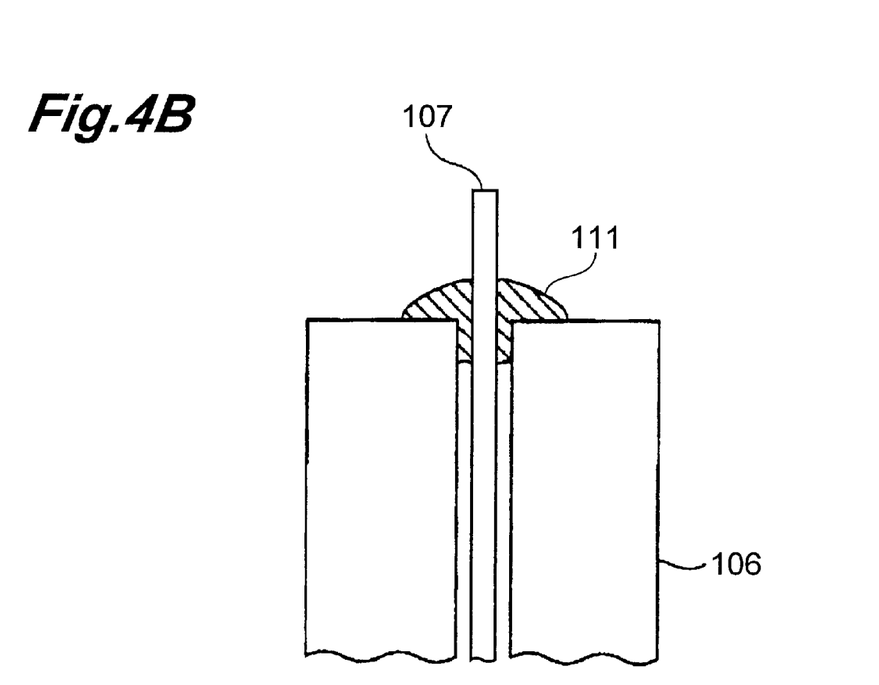

FIGS. 4A and 4B are views for explaining the detail of the securing operation with solder in a series of steps such as those shown in FIGS. 3A to 3C.

As shown in FIG. 4A, securing is carried out in a state where the grating fiber 107 is inserted into the ferrule 106. The side face of the grating fiber 107 has already been coated with metal plating made of an Ni—Au alloy or the like. Then, as shown in FIG. 4B, several pieces of ball-shaped solder 111a, 111b are disposed on the grating fiber 107 and are melted by microwave heating. After such processing, the grating fiber 107 is secured to the end of the ferrule 106 with the solder 111 as shown in FIG. 4B.

However, it is difficult to place the solder balls 111a, 111b, a diameter of about 0.2 to 0.5 mm, at their appropriate positions on a flat end face of the ferrule 106 whose outer diameter is about 1 mm.

Figure 5:
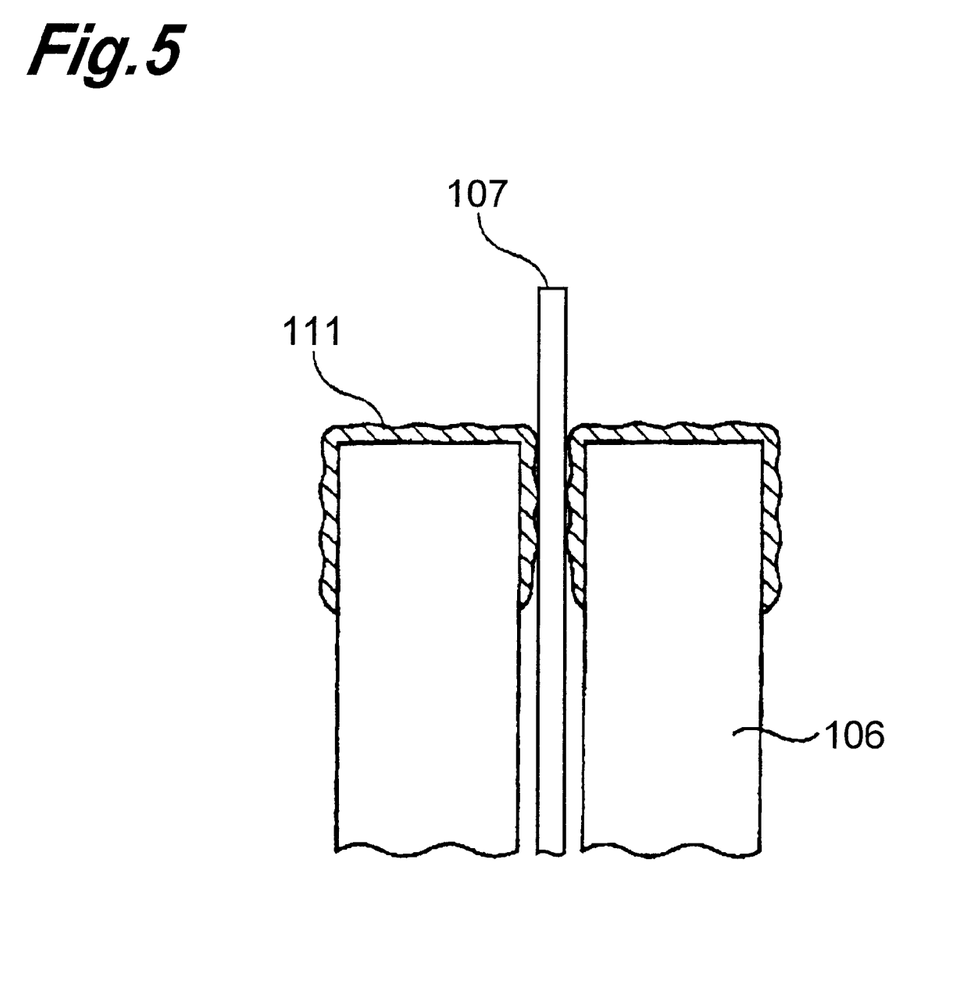
FIG. 5 is a view for explaining a problem attributable to the steps shown in FIGS. 4A and 4B.

Also, when the grating fiber 107 which the ferrule 106 is attached thereto is used in an airtight package, it will be inevitable to use flux free solder because of an outgas with organic ingredient. However, flux free solder is less likely to wet to its priming, whereby there is a possibility of the solder 111 flowing into the gap between the grating fiber 107 and the ferrule 106 or flowing out of the ferrule 106 as shown in FIG. 5.

The ferrule assembly of the present embodiment is characterized in that it comprises a structure which can overcome problems such as those mentioned above, reliably secure an optical fiber and a ferrule to each other. In the embodiment, the optical fiber to be secured to the ferrule with solder is not restricted to a grating fiber.

Figure 6:
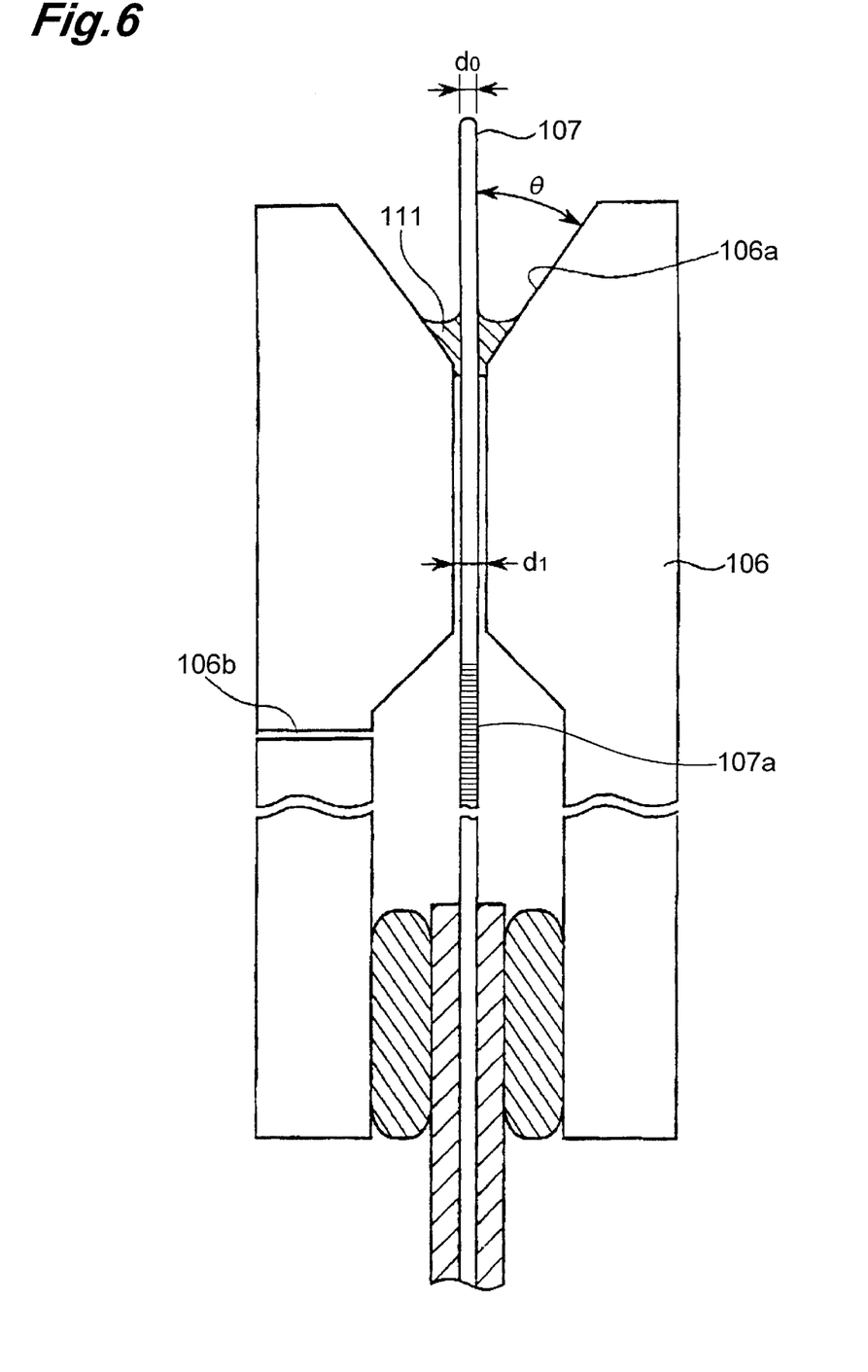
FIG. 6 is a view showing a cross-sectional structure of the ferrule assembly of the present invention.

The main feature of the ferrule assembly according to the embodiment lies in that the form of the end portion of the ferrule 106 are optimized such that the solder 11 attaches to both of the optical fiber 107 and the ferrule 106 as shown in FIG. 6.

In the embodiment, the end portion of the ferrule 106 is formed with a tapered opening. The inner face of the tapered opening forms an angle of at least 50° but less than 65° with respect to the side face of the optical fiber 107. If this angle is 65° or greater, the melted solder may flow out widely. On the other hand, if the angle is less than 50°, the amount of solder need to secure the optical fiber 107 may not be accommodated in the tapered opening. Also, the area where the solder attaches to the optical fiber 107 is elongated, which is more likely to influence optical characteristics of the optical fiber 107.

Further, according to a preferred mode of the embodiment, the inside diameter of the ferrule 106 is designed such that the gap between the optical fiber 107 and the inner wall face of the ferrule 106 is at least 1 $\mu$m but not exceeding 10 $\mu$m. That is, if the gap exceeds the upper limit thereof, then the melted solder may flow into the inside of the ferrule 106, whereby the securing of the optical fiber 107 at the end portion of the ferrule 106 becomes insufficient. If the gap is narrower than the lower limit thereof, then it becomes difficult to insert the optical fiber 107.

The solder used for securing the optical fiber 107 is preferably at least one of Sn, Pb, Au, Ag, and In. On the other hand, it is preferred that the region where solder is mounted on the surface of the ferrule 106 be plated with one of Ni and Cr, and Au successively, or with Au directly.

The configuration of the ferrule assembly according to the embodiment will now be explained with reference to drawings. The following disclosure, however, relates only to an embodiment and does not restrict the technical scope of the present invention at all.

FIG. 6 is a sectional view showing characteristic portions of the ferrule assembly of the present invention. This ferrule assembly is applicable to the optical modules shown in FIG. 1.

As shown in FIG. 6, the end portion of the ferrule 106 is formed with a tapered opening 106a such that the inside diameter of the through hole increases toward the end portion. To such a ferrule 106, the optical fiber 107 (the grating fiber provided with the Bragg grating 107a) inserted therein is secured with a resin and the solder 111 on the end sides of the ferrule 106, respectively. Since the inside of the ferrule 106 would be sealed with the resin and the solder 111, the ferrule 106 is provided with a vent hole 106b, to leak the air from the inside of the ferrule 106. The vent hole 106b also contributes to facilitating the adhesion of solder 111.

In the ferrule assembly, the angle $\theta$ between the inner face 106a of the tapered opening and the side face of the optical fiber 107, and the size of the inside diameter d1 of the ferrule 106 with respect to the outer diameter d0 of the optical fiber 107 are defined as mentioned above. For comparison, a plurality of ferrules with the above-mentioned angle $\theta$ and inner diameter d1 being varied were prepared, and assembled samples were evaluated with respect to each specification.

Each of the prepared ferrule samples is made of stainless steel, whose surface is plated with one of Ni and Cr, and Au successively, or with Au directly. A ferrule made of plastics or ceramics can also be handled in a manner similar to the embodiment when plated with one of Ni and Cr, and Au successively, or with Au directly. The ferrule 106 has an outer diameter of 1.6 mm and a length of 10 mm. The inner diameter of the tapered opening is 0.9 mm. The form of the tapered opening is designed so as to yield a depth of about 260 μm when the angle θ is 60°. Further, the length of the securing portion is set to about 0.5 mm, and the inner diameter of the remaining portion (accommodating portion) of the ferrule is set to about 0.5 mm. The step between the larger diameter portion and smaller diameter portion is left so as to keep its shape formed upon processing.

The prepared optical fiber 107 has an outer diameter of 125 μm in a state where the coating layer 170 is removed. The end portion is rounded, so that the end portion in the final ferrule assembly protrudes from the end face of the ferrule by about 1.0 to 1.3 mm. Further, the end portion of the optical fiber 107 is formed with the Bragg grating 107a over a length of about 5 mm.

Figure 7A:
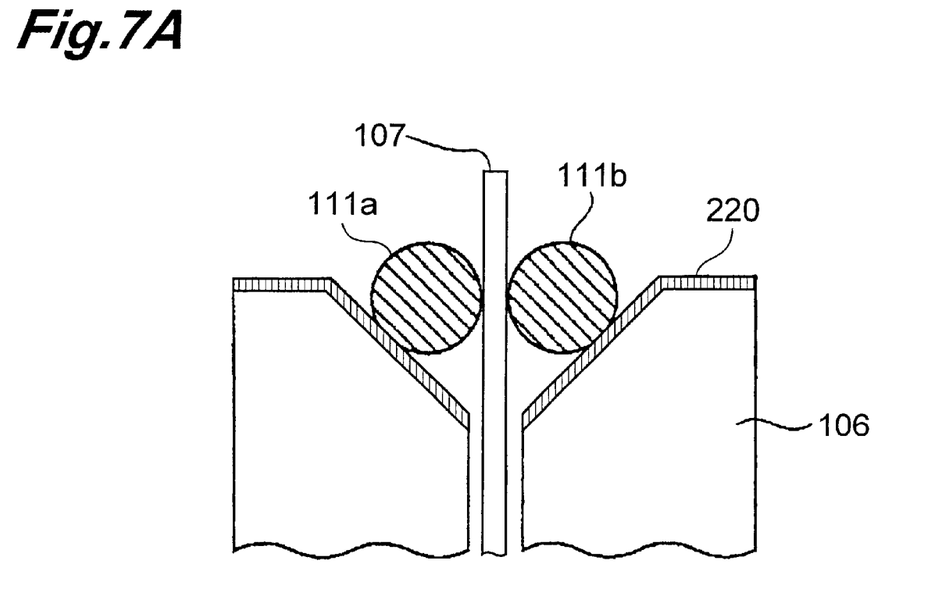
FIGS. 7A and 7B are views for explaining steps of manufacturing the ferrule assembly shown in FIG. 6, a process of securing the grating fiber to the ferrule in particular.
Figure 7B:
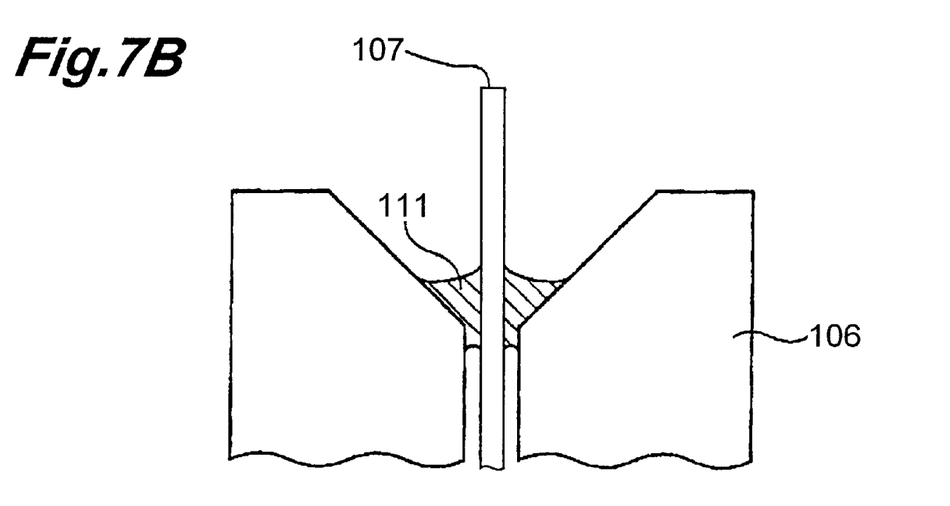

FIGS. 7A and 7 a re views for explaining steps of manufacturing the ferrule assembly of the embodiment.

First, as shown in FIG. 7A, the optical fiber 107 is inserted into the ferrule 106. The side face of the optical fiber 107 has already been provided with a metal plating 220 made of Au, or laminated with one of Ni and Cr, and Au successively. Subsequently, several solder balls are placed at the tapered opening so as to surround the optical fiber 107, and then are melted by microwave heating. After such processing, the optical fiber 107 is secured to the ferrule 106 with the solder 111 as shown in FIG. 7B.

A plurality of ferrule assembly samples were prepared by a series of steps mentioned above. Employed as the solder balls were those each having a diameter of 0.2 mm. The table of FIG. 9 summarizes evaluations of each sample.

Figure 8:
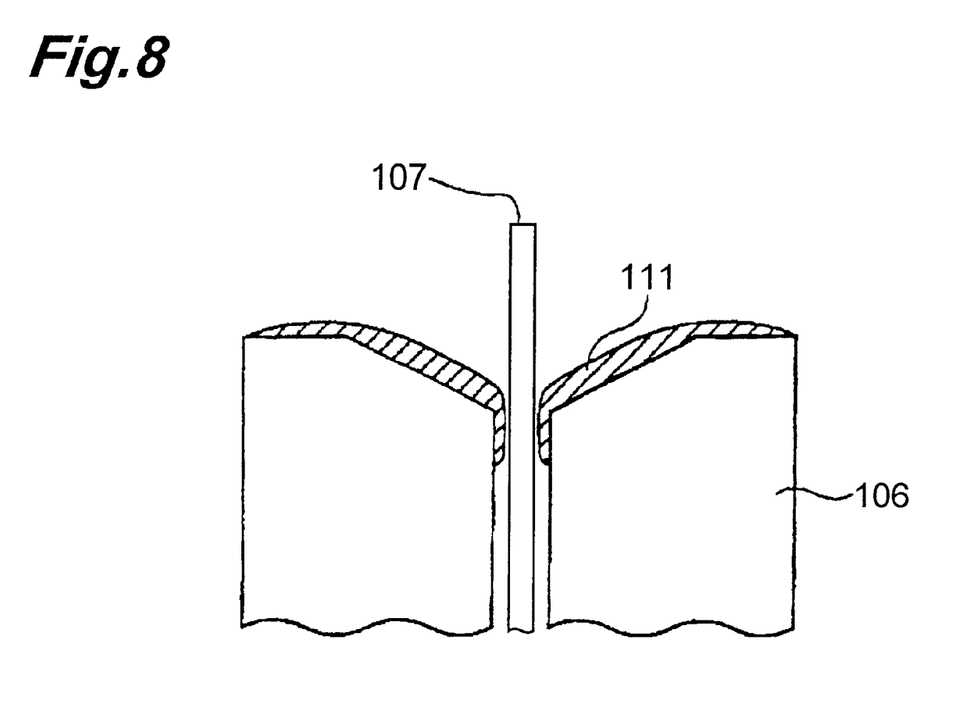
FIG. 8 is a view for explaining a failure case of plating between the ferrule and the optical fiber.
Figure 9:
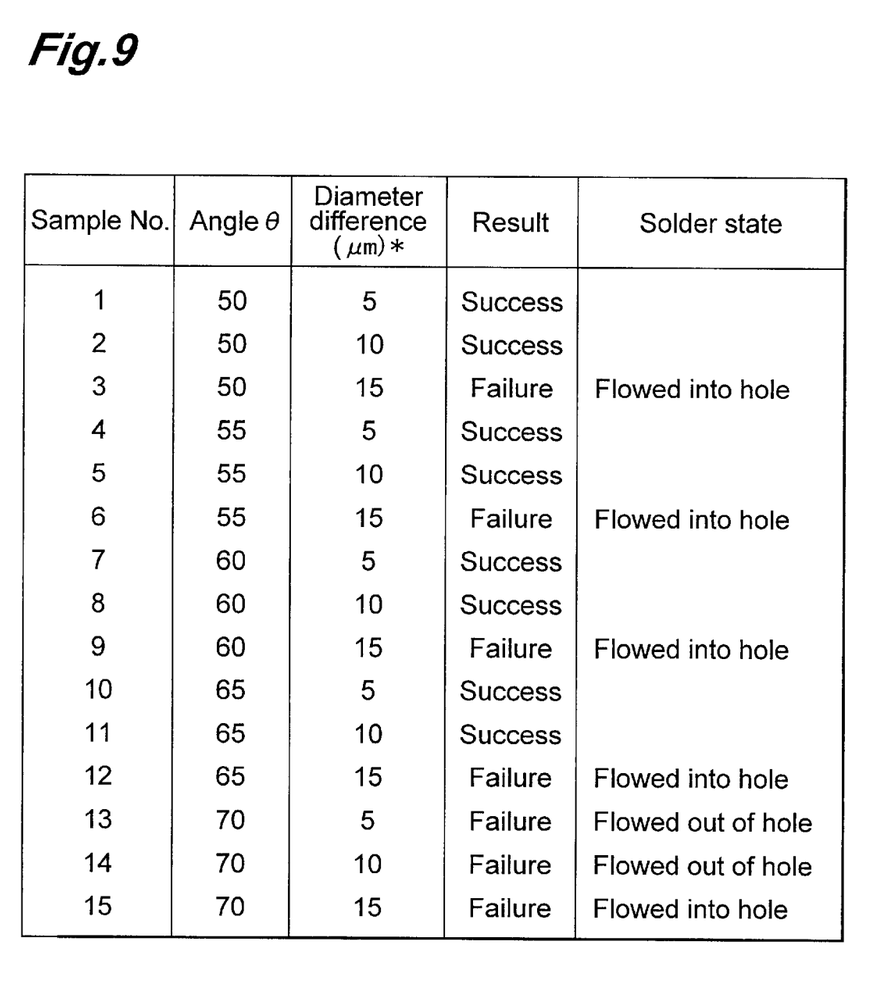
FIG. 9 is a table showing results of evaluations of manufactured ferrule assemblies.

In the table of FIG. 9, the cases where "Failure", is noted in the column of "Result" refer to those in which the solder 111 flows to the outside or inside of the ferrule as shown in FIG. 8. Also, symbol "*" in the table means ½ of the difference between the outer diameter d0 of the optical fiber 107 and the inner diameter d1 of the ferrule 106.

As can be seen from the above-mentioned results, appropriately choosing the inside diameter of the through hole of the ferrule 106 and shaping its end portion into an appropriate form enables the optical fiber 107 to be favorably secured with the solder 111.

In accordance with the present invention, as explained in detail in the foregoing, since a space for accommodating the Bragg grating is provided within the ferrule, no mechanical stress is applied to the fiber grating. Consequently, the fiber grating exhibits the initially-set characteristics, whereby the designed oscillation wave length can be obtained with a good reproducibility. Due to such effects of the invention, the yield in manufacture of the optical module and the stability of the product thereof are improved.

Further, since an end portion of the ferrule is provided with a tapered opening for attaching solder thereto, the ferrule assembly of the present invention can reliably secure the optical fiber and the ferrule with the solder, thus enabling the manufacturing efficiency of the finally-obtained semiconductor laser module (optical module) to improve.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

The basic Japanese Applications No. 7-090561 filed on Apr. 17, 1995, No. 10-200346 filed on Jul. 15, 1998, and No. 11-123244 filed on Apr. 28, 1999 are hereby incorporated by reference.

What is claimed is:

1. A ferrule assembly comprising:

an optical fiber in which a Bragg grating is provided;

a ferrule attached to an end portion of said optical fiber including one end face thereof, said ferrule having a securing portion having a predetermined inside diameter so as to secure said optical fiber and an accommodating portion having an inside diameter greater than that of said securing portion so as to accommodate a grating region where said Bragg grating is arranged; and a tapered portion, for securing said optical fiber with solder, provided at an end face of the securing portion of said ferrule, wherein a part of said optical fiber excluding said grating region is secured to the securing portion of said ferrule, said grating region in said optical fiber being accommodated in the accommodating portion of said ferrule in a state separated from an inner wall of said accommodating portion without being secured to said ferrule.

2. A ferrule assembly according to claim 1, wherein the securing portion of said ferrule has a first insertion bore having such a diameter that said optical fiber can be supported thereby in a state where said first insertion bore substantially aligns with an optical axis of said optical fiber; and wherein the accommodating portion of said ferrule has a second through hole having a diameter greater than that of said first through hole.

3. A ferrule assembly according to claim 1, wherein a gap between the inner wall of the accommodating portion of said ferrule and an outer peripheral face of said optical fiber is filled with a cushioning material which keeps said ferrule and said optical fiber from being bonded to each other.

4. A ferrule assembly according to claim 3, wherein said cushioning material includes one of epoxy resins.

5. A ferrule assembly according to claim 1, wherein said ferrule is made of one of metal and a combination of metal and metal-plated ceramic, said optical fiber being secured with solder to said ferrule at a plated part in the securing portion of said ferrule.

6. A ferrule assembly according to claim 1, wherein said optical fiber is secured to the securing portion of said ferrule at at least one of a first position between said grating region and said one end face and a second position on the opposite side from said first position across said grating region.

7. A ferrule assembly according to claim 1, wherein the end portion of said optical fiber including the one end face thereof protorudes from an end face of said ferrule by a predetermined length, said one end face being rounded with a predetermined curvature radius.

8. An optical module comprising:

a light-emitting device in which one end face on an emitting optical path acts as a reflecting mirror;

the ferrule assembly according to claim 1, said ferrule assembly having an optical fiber provided with a Bragg grating and a ferrule attached to an end portion of said optical fiber including one end face thereof in a state accommodating a part of said optical fiber; and a holding structure for holding said light-emitting device and said ferrule assembly at a predetermined position such that the reflecting mirror of said light-emitting device and said Bragg grating form a resonator.

9. A ferrule assembly comprising:

an optical fiber; and a ferrule attached to an end portion of said optical fiber, said ferrule having a through hole for accommodating said optical fiber and a tapered portion positioned at an opening end of said through hole;

wherein said through hole of said ferrule has a first portion having a predetermined inside diameter and a second portion having an inside diameter greater than that of said first portion; and wherein said optical fiber and said ferrule are secured with solder at the tapered portion of said ferrule.

10. A ferrule assembly according to claim 9, wherein an inner face of said tapered portion and a side face of said optical fiber form an angle of at least 50° but not exceeding 65°.

11. A ferrule assembly according to claim 9, wherein the distance between a part of said through hole excluding said tapered portion and a side face of said optical fiber is not greater than 15 $\mu$m.

12. A ferrule assembly according to claim 9, wherein the solder securing said optical fiber and said ferrule at said tapered portion includes at least one of Sn, Pb, Au, Ag, and In.

13. A ferrule assembly according to claim 9, wherein a side face of said optical fiber is plated with one of Ni and Cr, and Au successively, or with Au directly.

14. A ferrule assembly according to claim 9, wherein at least said tapered portion of said ferrule is plated with one of Ni and Cr, and Au successively, or with Au directly.

15. A ferrule assembly according to claim 9, wherein a gap between an inner wall of said second portion and an outer peripheral face of said optical fiber being filled with a resin.

16. A ferrule assembly according to claim 9, wherein a front end portion of said optical fiber including one end face thereof protrudes from the tapered portion of said ferrule by a predetermined length, said one end face being rounded with a predetermined radius of curvature.

17. An optical module comprising:

a light-emitting device in which one end face on an emitting optical path acts as a reflecting mirror;

a ferrule assembly according to claim 9, said ferrule assembly having an optical fiber provided with a Bragg grating and a ferrule attached to an end portion of said optical fiber including one end face thereof in a state accommodating a part of said optical fiber; and a holding structure for holding said light-emitting device and said ferrule assembly at a predetermined position.

18. An optical module according to claim 17, wherein a grating region of said optical fiber separated from said one end face by a predetermined distance is provided with a Bragg grating, said grating region being accommodated in said ferrule.

* * * * *